(12) United States Patent
Merassi et al.

(10) Patent No.: US 9,184,138 B2
(45) Date of Patent: Nov. 10, 2015

(54) SEMICONDUCTOR INTEGRATED DEVICE WITH MECHANICALLY DECOUPLED ACTIVE AREA AND RELATED MANUFACTURING PROCESS

(71) Applicants: STMicroelectronics (Grenoble 2) SAS, Grenoble (FR); STMicroelectronics S.r.l., Agrate Brianza (IT)

(72) Inventors: Angelo Antonio Merassi, Caponago (IT); Marco Ferrera, Concorezzo (IT); Marco Mantovani, Lainate (IT); Paolo Ferrari, Gallarate (IT); Benedetto Vigna, Potenza (IT)

(73) Assignees: STMicroelectronics (Grenoble 2) SAS, Grenoble (FR); STMicroelectronics S.r.l., Agrate Brianza (IT)

( * ) Notice: Subject to any disclaimer, the term of this patent is extended or adjusted under 35 U.S.C. 154(b) by 213 days.

(21) Appl. No.: 13/719,103

(22) Filed: Dec. 18, 2012

(65) Prior Publication Data

US 2013/0168840 A1     Jul. 4, 2013

(30) Foreign Application Priority Data

Dec. 29, 2011  (IT) ............................... TO2011A1233

(51) Int. Cl.
*H01L 23/00* (2006.01)
*H01L 21/56* (2006.01)
*H01L 23/16* (2006.01)
*H01L 23/31* (2006.01)

(52) U.S. Cl.
CPC .............. *H01L 23/562* (2013.01); *H01L 21/56* (2013.01); *H01L 23/16* (2013.01); *H01L 23/3107* (2013.01); *H01L 2224/32245* (2013.01); *H01L 2224/48091* (2013.01); *H01L 2224/48247* (2013.01); *H01L 2224/73265* (2013.01); *H01L 2924/1461* (2013.01)

(58) Field of Classification Search
CPC combination set(s) only.
See application file for complete search history.

(56) References Cited

U.S. PATENT DOCUMENTS

| | | | |
|---|---|---|---|
| 5,600,174 A | 2/1997 | Reay et al. | |
| 6,483,111 B1 | 11/2002 | Ishikawa et al. | |
| 7,015,572 B2* | 3/2006 | Yamaji | 257/686 |
| 7,019,364 B1 | 3/2006 | Sato et al. | |
| 7,167,373 B1* | 1/2007 | Hoang et al. | 361/749 |
| 7,659,581 B2* | 2/2010 | Chidambarrao et al. | 257/347 |
| 7,892,919 B2* | 2/2011 | Kim et al. | 438/254 |
| 2002/0041003 A1 | 4/2002 | Udrea et al. | |
| 2008/0315333 A1 | 12/2008 | Combi et al. | |
| 2009/0091001 A1 | 4/2009 | Park | |

(Continued)

FOREIGN PATENT DOCUMENTS

| | | |
|---|---|---|
| DE | 44 33 689 A1 | 3/1996 |
| WO | 98/11602 A1 | 3/1998 |

*Primary Examiner* — S. V. Clark
(74) *Attorney, Agent, or Firm* — Seed IP Law Group PLLC

(57) ABSTRACT

A semiconductor integrated device is provided with: a die having a body of semiconductor material with a front surface, and an active area arranged at the front surface; and a package having a support element carrying the die at a back surface of the body, and a coating material covering the die. The body includes a mechanical decoupling region, which mechanically decouples the active area from mechanical stresses induced by the package; the mechanical decoupling region is a trench arrangement within the body, which releases the active area from an external frame of the body, designed to absorb the mechanical stresses induced by the package.

21 Claims, 12 Drawing Sheets

(56) References Cited

U.S. PATENT DOCUMENTS

2010/0244246 A1* 9/2010 Caplet .......................... 257/738
2012/0267759 A1* 10/2012 Shroff et al. .................. 257/532
2013/0200439 A1* 8/2013 Doelle .......................... 257/254

* cited by examiner

SEMICONDUCTOR INTEGRATED DEVICE WITH MECHANICALLY DECOUPLED ACTIVE AREA AND RELATED MANUFACTURING PROCESS

BACKGROUND

1. Technical Field

The present disclosure relates to a semiconductor integrated device with mechanically decoupled active area, and to a related manufacturing process.

2. Description of the Related Art

The drift of electrical parameters is a very critical issue affecting semiconductor integrated devices; this drift is commonly due to mechanical deformations (e.g., bending) of the semiconductor die (or dice) within the package of the devices, due to stresses induced by the same package. This issue is especially critical in case of electronic components such as OA (Operational Amplifiers), ADC (Analog to Digital Converters), voltage regulators, or the like, where a desired value of relevant electrical quantities has to be kept accurately stable with time; or in case of micromechanical structures, whose mechanical properties directly affect the performances of the integrated devices.

As it is known, an integrated device includes one or more dice of semiconductor material (e.g., silicon), in which electronic circuits (e.g., an ASIC—Application Specific Integrated Circuit) and/or microelectromechanical structures are made (in the case of MEMS—MicroElectroMechanical Systems), and which are encapsulated in a package, protecting and covering the dice and providing suitable electrical connections to the outside, e.g., for soldering to an external printed circuit board. Common packages are the so called SO or SOIC (Small Outline Integrated Circuit) packages, or the BGA (Ball Grid Arrays) or LGA (Land Grid Array) packages, which offer reduced area occupation and high density of the external electrical contacts.

FIG. 1 schematically shows an example of an integrated device with a SO package, denoted as a whole with 1, provided with a die 2 and a package 3 enclosing the die 2. Die 2 may include a micromechanical detection structure and/or an ASIC including electronic circuits (clearly, the integrated device 1 may also include several dice, arranged in known stacked or side-by-side configurations); in a manner not shown, die 2 includes a body of semiconductor material, including an active portion wherein electronic components or micromechanical structures are formed, and overlying layers of metal and/or dielectric (passivation) materials.

Package 3 includes a die-carrier 4 (usually referred to as "die pad" in similar packaging structures and having a support function for the die 2), having an internal surface 4a to which the die 2 of the integrated device 1 is attached via an adhesive layer 5, e.g., a glue or a tape (usually referred to as "die attach film"), and an external surface 4b, which may also define an external surface of the package 3, or, as in the example shown, be arranged inside the package 3.

A coating and protecting material, generally a mold compound 6, e.g., a resin material, covers and surround the die-carrier 4 and the die 2 (in particular, top and side surfaces thereof, where the die 2 is not attached to the die-carrier 4), protecting the same from the external environment.

Suitable electrical connections in the form of wires 7 (using the so called "wire bonding" technique) electrically connect the die 2 to a lead-frame 8, carrying electrical contacts, so called leads 9, protruding outside the package 3 (and the mold compound 6) for the electrical connection to the outside, e.g., to an external printed circuit board (here not shown).

In particular, the die 2 is subject to mechanical stresses within the package 3, which result from the balancing of forces that the various packaging materials contacting the same die 2 (such as resin, glue, tape, die-pad) apply thereto; accordingly, and due to these mechanical stresses, bending of one or more surfaces of the die 2 may occur. In general, these forces are denoted as package-induced stresses and amount to encapsulation stresses and thermally-induced stresses due to the different thermal expansion coefficients of the various materials within the package.

A proposed solution to cope with this issue involves a suitable selection of the package materials (e.g., resin, die-pad, glue or tape) and their dimensions, and a proper designing of the die, e.g., in terms of the thickness of the semiconductor material. This approach basically amounts to an exercise of optimization, aimed at a joined selection of suitable materials and parameters that do not cause deformations, e.g., bending, of the semiconductor die, e.g., under thermal stresses, or in any case limit the same deformations.

Clearly, this solution is not robust against spreads of the properties of the package materials and dimensions, e.g., due to the packaging process or aging, which may not be taken into account at the design stage.

BRIEF SUMMARY

The present disclosure is directed to a semiconductor integrated device having improved performances with respect to mechanical deformations induced by the package, and in particular allowing to limit or avoid drifts of device parameters due to package-induced stresses.

BRIEF DESCRIPTION OF THE SEVERAL VIEWS OF THE DRAWINGS

For a better understanding of the present disclosure, preferred embodiments thereof are now described, purely by way of non-limiting examples and with reference to the attached drawings, wherein.

DETAILED DESCRIPTION

According to an aspect of the present disclosure, a mechanical decoupling region is provided in the semiconductor die of the integrated device; the mechanical decoupling region is configured to mechanically decouple (or release) an active area of the die from the stresses deriving from the package, the active area thus remaining substantially undeformed notwithstanding possible package-induced stresses acting on the die as a whole.

The active area advantageously includes portions of the die that are used for the operation of the integrated device (e.g., including a microelectromechanical detection structure, such as a suspended membrane and the related electrodes, in case of a MEMS die, or an electronic circuit, such as an operational amplifier, in case of an ASIC die), which, if subjected to stresses, would cause critical drifts of the electrical/mechanical parameters of the same integrated device (e.g., of an output voltage thereof). In general, as it is usual in the field, the active area of the die may be defined as the area including the electrical components or the mechanical structures defining (or being critical to) the operation of the integrated device.

Figure 1:
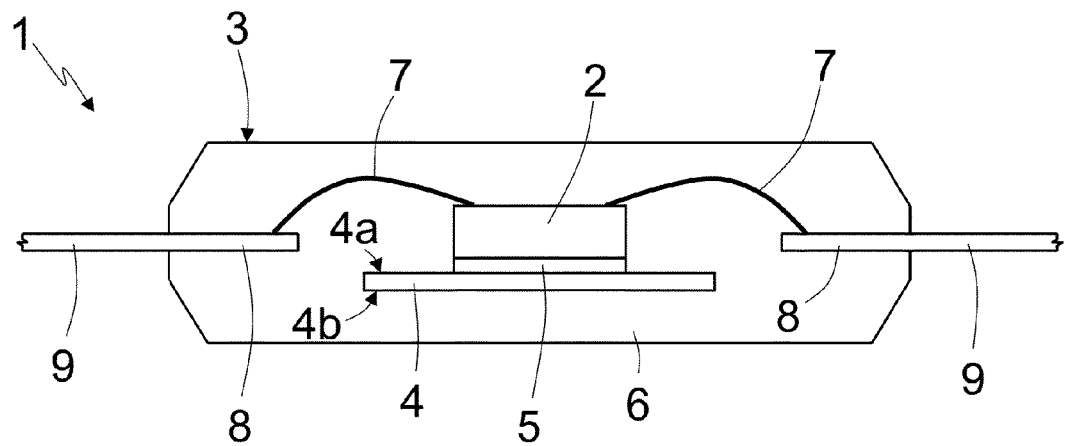
FIG. 1 shows a schematic cross-section of a known semiconductor integrated device.
Figure 2A:
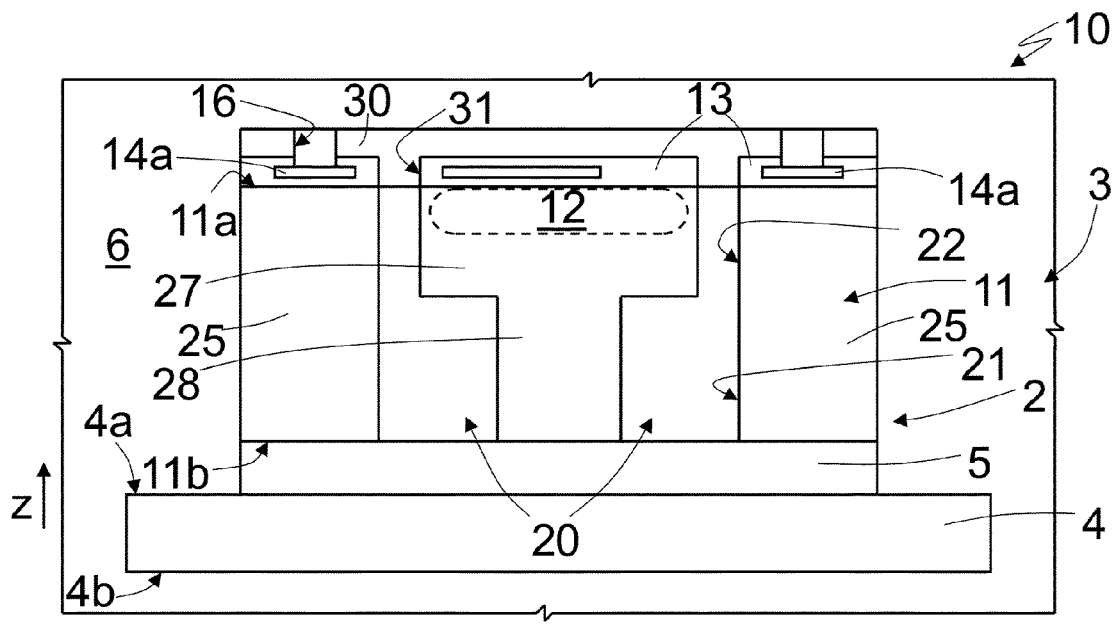
FIGS. 2a, 2b show a schematic cross-section and, respectively, an enlarged top-plan view of a portion of a semiconductor integrated device according to a first embodiment.

FIG. 2a (which is not shown to scale, nor are the following Figures) depicts a portion of an integrated device according to a first embodiment, which is relevant for the understanding of the present disclosure (generally, same reference numbers as those used in FIG. 1 denote similar elements, which are not discussed again in detail).

The integrated device, here denoted with 10, includes a die 2 and a package 3 covering the die 2, of which only a portion is shown, including a die-carrier 4 and a mold compound 6 (it is clear that the remainder of the package may be of any known type, e.g., as the one shown in FIG. 1); the die 2 is attached to an internal surface 4a of the die-carrier 4 via an adhesive layer 5.

In particular, the die 2 includes a body 11 of semiconductor material, e.g., silicon, having a front surface 11a and a back surface 11b, opposite to each other along a vertical direction z (the front and back surfaces 11a, 11b extending in a plane transverse to the same vertical direction z). The body 11 is attached at its back surface 11b to the die-carrier 4 via the adhesive layer 5, and includes, at its front surface 11a, an active area 12, where electronic components and/or mechanical structures are formed.

Insulating regions 13, e.g., made of silicon dioxide, and conductive regions 14, e.g., made of metal, are provided above the front surface 11a of the body 11, the conductive regions 14 being generally arranged within the insulating regions 13 (as is shown in the exemplary schematic depiction of FIG. 2a). In particular, conductive regions 14 include electrical contact pads 14a, arranged outside the active area 12 of the die 2, and designed for electrical contact of the same active area 12, through conductive paths (here not shown). First openings 16 are provided (during the manufacturing process) through the insulating regions 13 so as to reach at least some of the conductive regions 14, e.g., the electrical contact pads 14a, and allow electrical contact thereto (e.g., via electrical wires with the "wire-bonding technique", in a known manner, here not shown).

In particular, the die 2 includes a mechanical decoupling region 20, which is operatively associated to the active area 12 and configured to avoid or reduce mechanical stresses acting on the same active area 12, e.g., induced by the package 3.

Figure 2B:
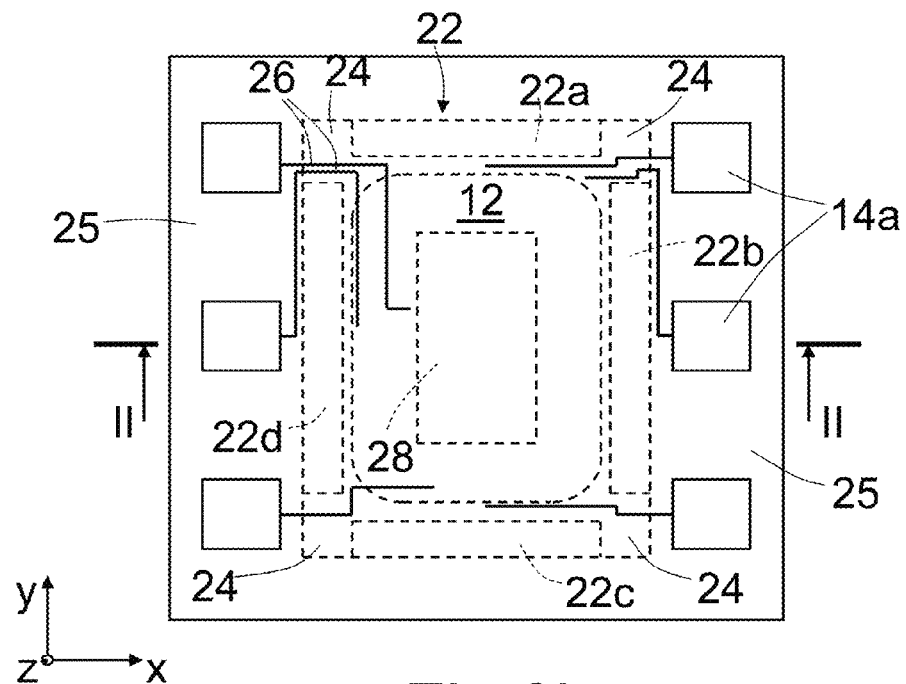

In detail, reference is also made to FIG. 2b, mechanical decoupling region 20 includes here: a first decoupling trench 21, which extends into the body 11 starting from the back surface 11b thereof, having a rectangular ring shape in plan view (in a horizontal plane xy defined by a first and a second horizontal directions x, y); and a second decoupling trench 22, which extends from the front surface 11a of the body 11 up to, and joining with, the first decoupling trench 21, and also substantially surrounds the active area 12 of the die 2 (here having a generically rectangular or elliptical shape in plan view, and arranged in a central portion of the body 11 with respect to the horizontal plane xy). The first and second decoupling trenches 21, 22 thus define together passing trenches extending from the back surface 11b of the body to its front surface 11a.

In the embodiment shown, the second decoupling trench 22 includes four trench portions 22a-22d, having a generically rectangular shape in plan view and arranged surrounding the active area 12 parallel to, and beside, a respective side of the active area 12. The width of the trench portions 22a-22d is smaller than that of the first decoupling trench 21 (along a respective portion of the square ring).

The second decoupling trench 22 also defines at the corners of the active area 12 first connecting portions 24 of the body 11, which connect the same active area 12 to an external frame 25 of the body 11. The previously defined conductive paths, schematically shown and denoted with 26 in FIG. 2b, run, at least in part, at the surface of these first connecting portions 24, so as to electrically connect portions of the active area 12 to respective electrical contact pads 14a.

The mechanical decoupling region 20 thus defines within the body 11a mechanically decoupled "mushroom"-shaped structure, having a head or top part 27, including the active area 12, and a stem or bottom part, denoted with 28, joined to the top part 27 and reaching the back surface 11b of the body 11, being attached to the die-carrier 4. The first decoupling trench 21 is arranged at least in part below a portion of the active area 12, so as to define the stem part 28 of the mushroom structure.

Moreover, a protective layer 30, e.g., a polyamide or dry film is provided above the insulating layer 13 and conductive regions 14 and the front surface 11a of the body 11; in particular, second openings 31 are provided (during the manufacturing process) through the insulating layer 13 at the second decoupling trench 22, so that the protective layer 30 fills the second openings 31, reaching the front surface 11a of the body 11 at the same second decoupling trench 22. Protective layer 30 preferably has a Young Modulus of a much lesser value than that of the semiconductor material of the body 11 and the resin material of the mold compound 6 (e.g., equal to 180 MPa).

Due to the particular structure described, any stress coming from the package 3, e.g., due to a bending thereof, is not transferred to the active area 12. In particular, the active area 12 has a very small anchoring area on the adhesive layer 5, at the base of the stem 28, and the external frame 25 defined by the first and second decoupling trenches 21, 22 is compliant and absorbs any bending of the die-carrier 4 and mold compound 6, leaving the mushroom structure substantially unstressed. In other words, the decoupling region 20 defines an island including the active area 12, which is decoupled from the external frame 25 and thus is not subjected to stresses.

In an exemplary structure, the second decoupling trench 22 may have a width of 10 µm; the thickness of the protective layer 30 may be of 50 µm; the head 27 may have a height (in the vertical direction z) of 200-300 µm and the stem 28 may have a height of 100-200 µm; the side of the head 27 in top-plan view may be of 400-500 µm, while that of the stem 28 may be of 200-300 µm.

Figure 3:
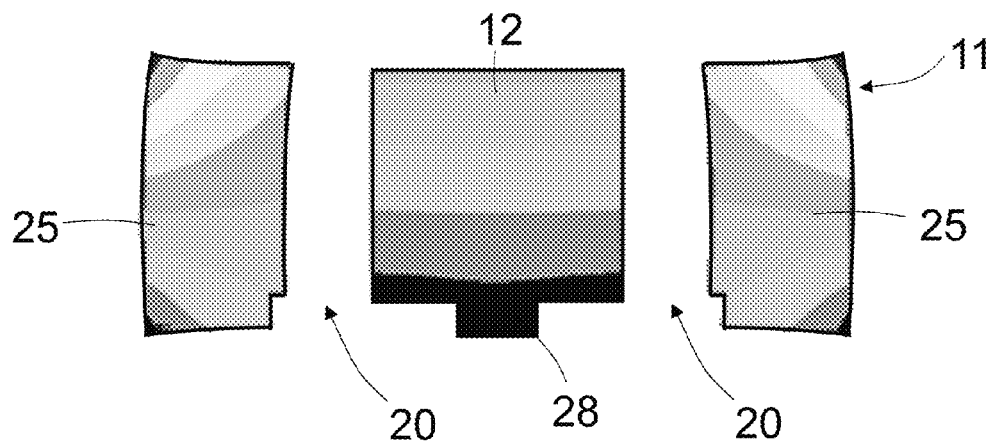
FIG. 3 shows the results of a static analysis of deformations of part of the device of FIGS. 2a, 2b.
Figure 3:

This operating principle has been shown by the Applicant via tests, simulations and a static analysis of the out-of-plane deformations, the results of the latter being shown in FIG. 3, which clearly shows the substantial absence of deformations of the active area 12.

The manufacturing process of the die 2 may include formation of both the first and second trenches 21, 22 with respective etching steps starting from the back surface 11b of the body 11; or formation of the second trench 22 with an etching step starting from the front surface 11a of the body 11.

Figure 4A:
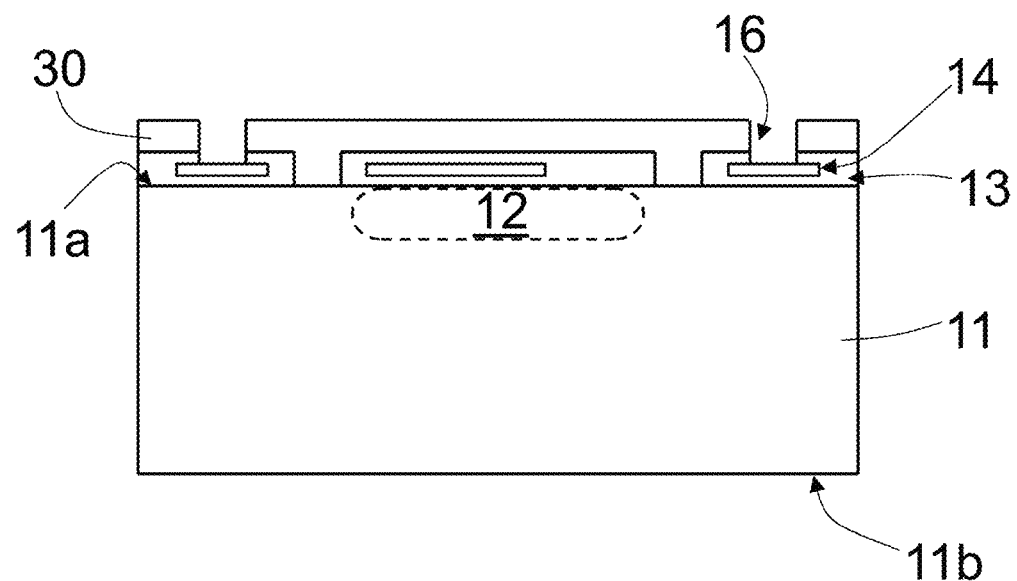
FIGS. 4a-4c show schematic cross-sections of the device of FIGS. 2a, 2b in subsequent steps of a manufacturing process according to a first variant.

In detail, as shown in FIG. 4a, in a first variant, the manufacturing process includes completion of the formation of the active area 12 within the body 11 and of the various layers above the front surface 11a thereof (insulating regions 13, conductive regions 14 and protective layer 30).

Figure 4B:
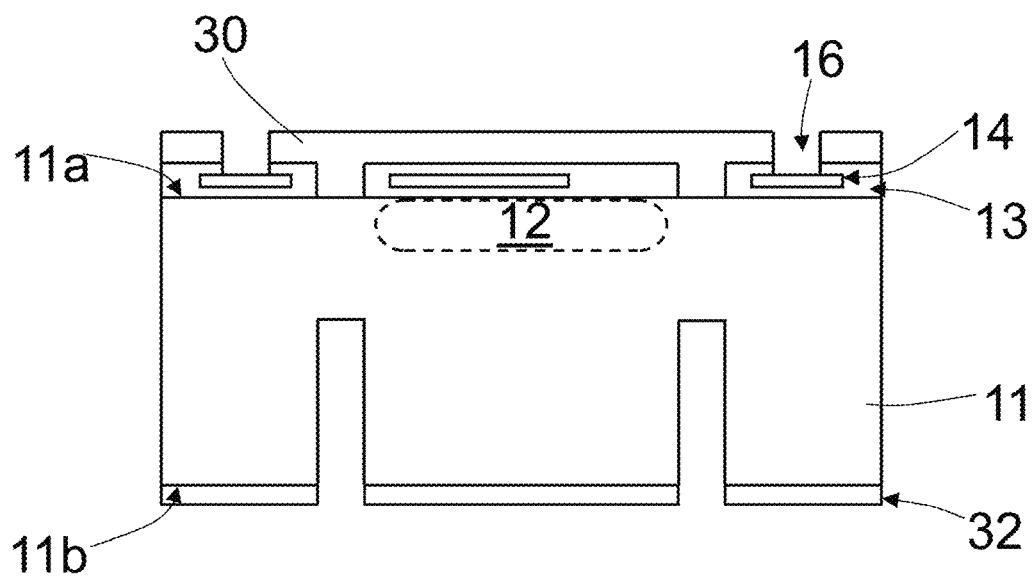

Then, FIG. 4b, a first etching is performed from the back of the body 11 through a first mask layer 32, realizing a partial silicon etching, with a depth that substantially corresponds to the height of the head 27. This first etching step is performed with a given time duration, so as to stop within the body 11, at a distance from the front surface 11a. The first mask layer 32 defines openings for the etching agent corresponding to the width and positions of the second decoupling trench 22.

Figure 4C:
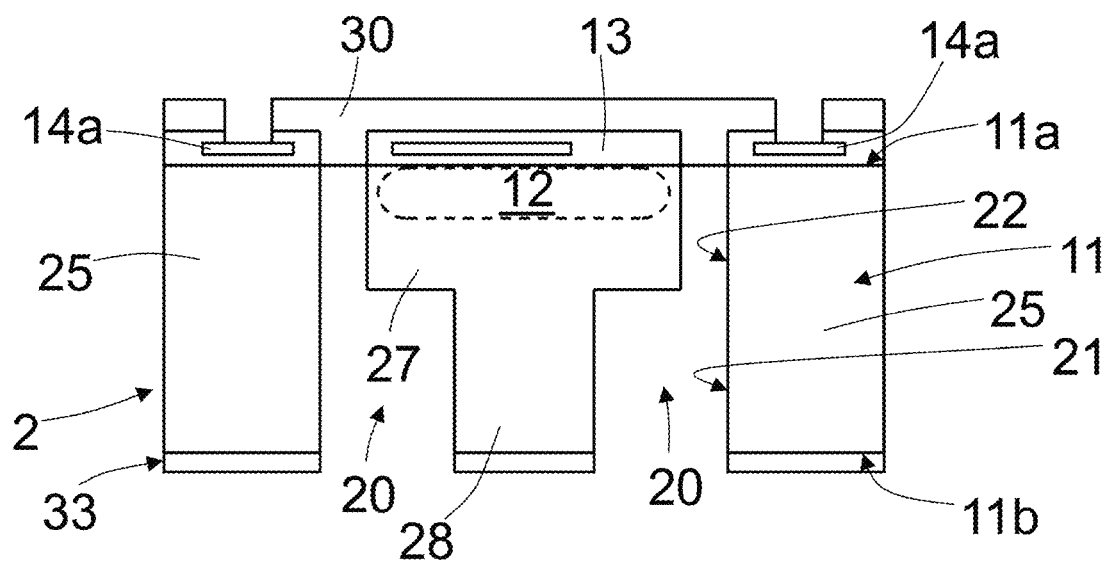

In a subsequent step, FIG. 4c, a second etching step is performed, again starting from the back surface 11b of the body 11, with a second mask layer 33 having openings with a width and shape corresponding to the first decoupling trench 21. The second etching is performed until reaching the front surface 11a and the overlying protective layer 30 (the etching being selective with respect to the material of the same protective layer 30), and leads to definition of both first and second decoupling trenches 21, 22.

In a manner that is not shown, the manufacturing process continues with the packaging of the die 2, and in particular with attaching the die 2 to the die-carrier 4 and molding of the mold compound 6.

Figure 5A:
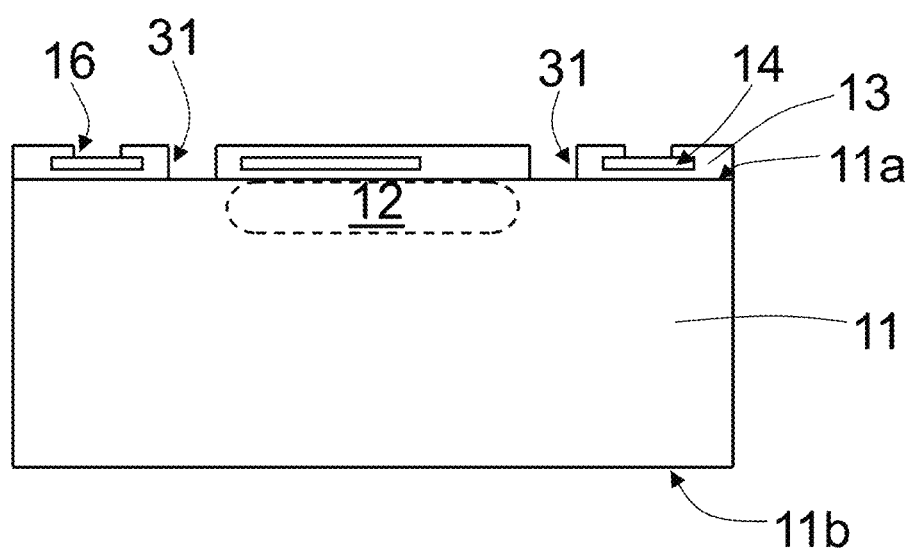
FIGS. 5a-5d show schematic cross-sections of the device of FIGS. 2a, 2b in subsequent steps of a manufacturing process according to a second variant.

Another variant of the manufacturing process, as shown starting from FIG. 5a, again includes the formation of the active area 12 within the body 11 and also of the insulating regions 13 and conductive regions 14 thereon, but not of the protective layer 30 (only the first and second openings 16, 31 are provided through the insulating regions 3 with a suitable mask-etching step).

Figure 5B:
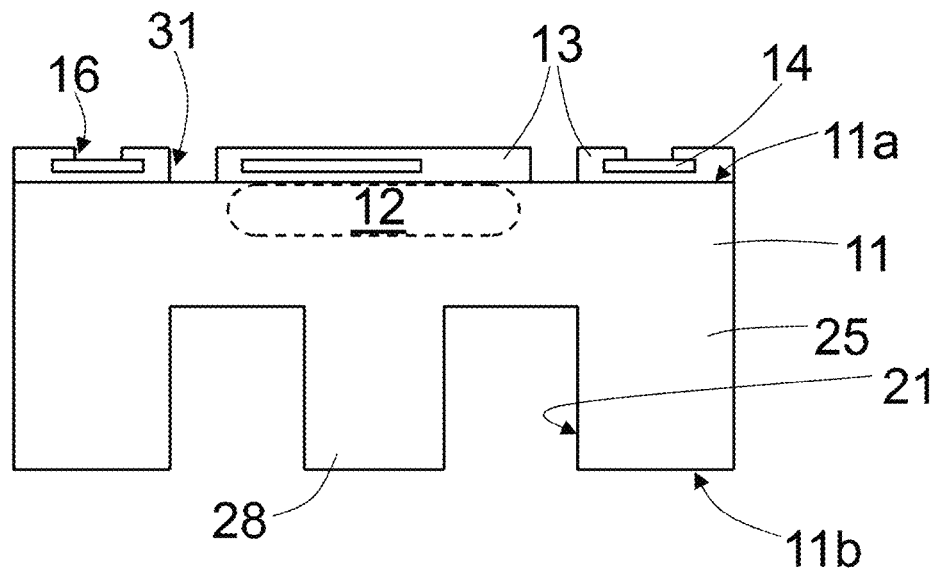

Then, FIG. 5b, a first etching is performed from the back of the body 11, with a mask layer (not shown) having openings with a width and shape corresponding to the first decoupling trench 21 (as the above defined second mask layer 33), and a given time duration, so as to define the first decoupling trench 21.

Figure 5C:
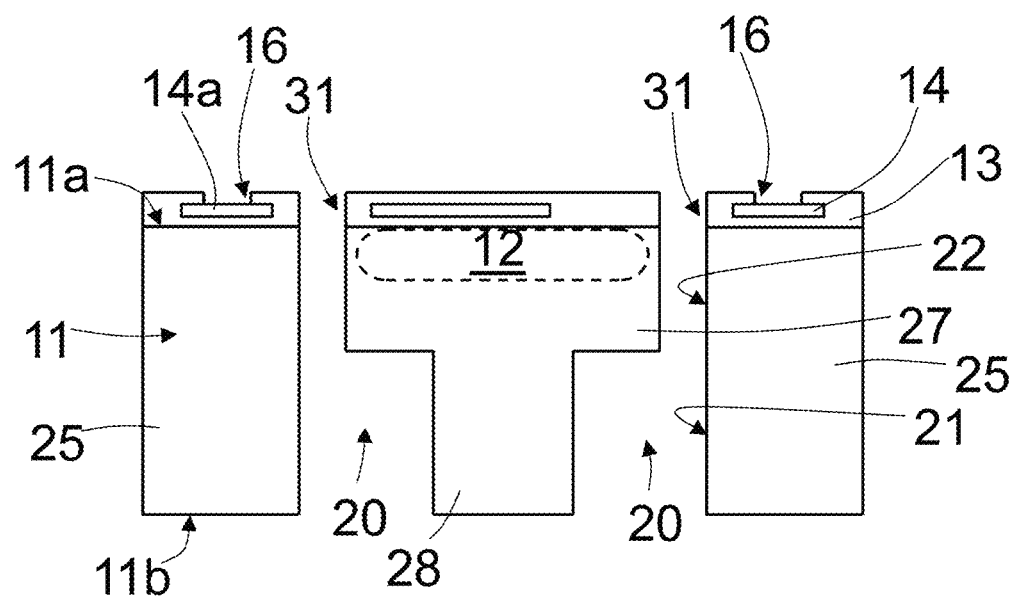

Afterwards, FIG. 5c, a second etching is performed from the front surface 11a of the body 11, using the insulating regions 13 and second openings 31 as etching mask, in order to define the second decoupling trench 22, reaching the first decoupling trench 21.

Figure 5D:
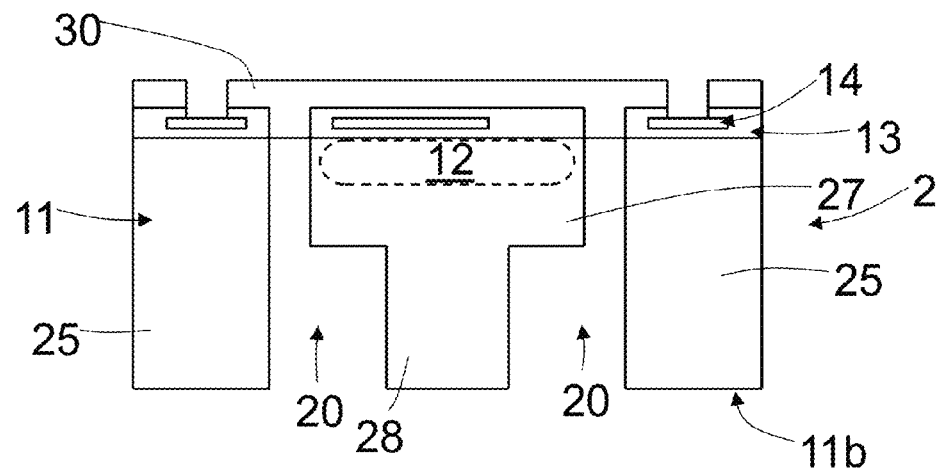

In a subsequent step, FIG. 5d, the protective layer 30 is formed above the front surface 11a of the body 11, preferably stacking the dry film via a lamination process, so that the same film does not fill the first and second decoupling trenches 21, 22.

Figure 6:
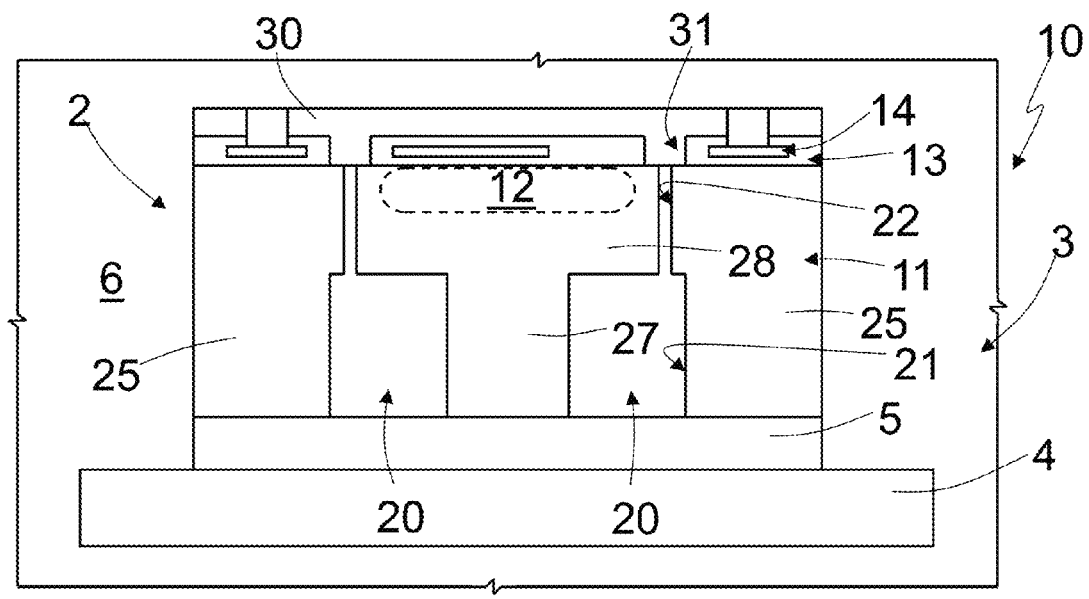
FIG. 6 shows a schematic cross-section of a portion of a semiconductor integrated device according to a second embodiment.

In a further variant of the process, again including a front-etching step for the formation of the second decoupling trench 22, it is possible to envisage a different width for the second decoupling trench 22 and second openings 31, resulting in the device shown in FIG. 6. This variant may be advantageous to reduce the risk that the protective layer 30 enters the second decoupling trench 22.

Figure 7:
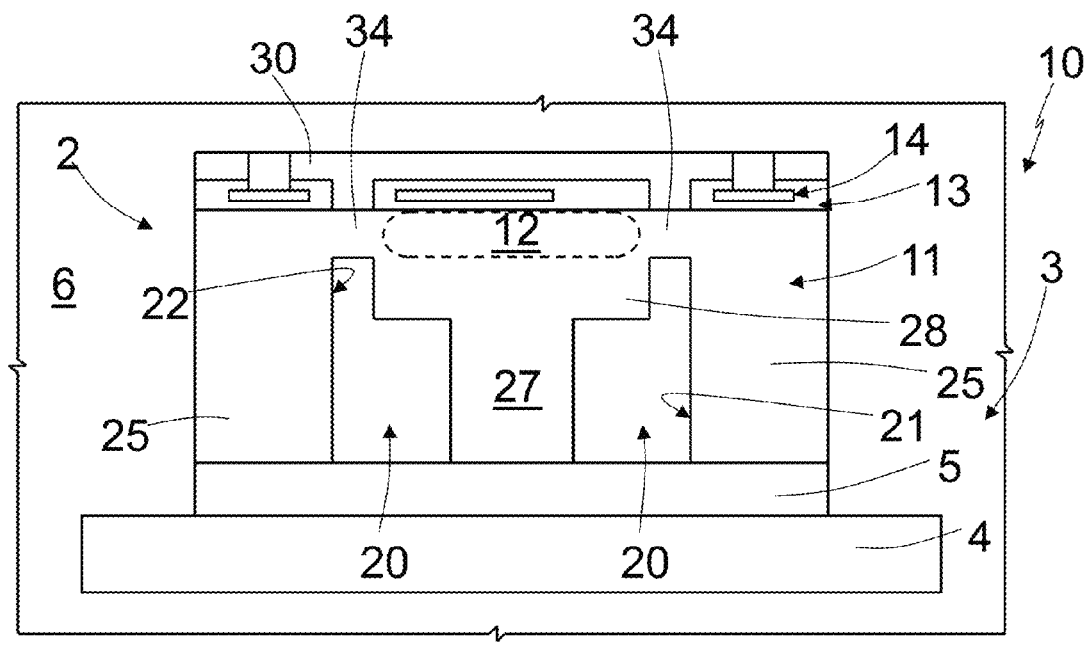
FIG. 7 shows a schematic cross-section of a portion of a semiconductor integrated device according to a third embodiment.

FIG. 7 shows a second embodiment of the integrate device 10, which differs from the embodiment of FIGS. 2a-2b due to a different configuration of the decoupling region 20.

In particular, the second decoupling trench 22 does not extend here up to the front surface 11a of the body 11 (passing trenches are thus not defined in the body 11 together with the first decoupling trench 21); a uniform surface layer 34 of the body 11 thus remain between the front surface 11a and the second decoupling trench 22.

This second embodiment provides a more robust structure with respect to molding stresses, avoiding possible breakage of the protective layer 30 during the molding step of the package 3 (indeed, in this case, no void regions are present below the same protective layer 30).

The manufacturing process for the formation of this structure is not discussed in detail, since it will be apparent from what was previously discussed concerning the first embodiment. In any case, it is clear that both the first and the second decoupling trenches 21, 22 are formed via a back-etching with a respective time duration and etching mask layer.

The operating principle of the decoupling region 20 is in any case the same as the one previously discussed, since the surface layer 34 constitutes a weak joint to the external frame 25, which continues to be compliant and to absorb the package deformations, leaving the active area 12 substantially not subject to stresses or subject to substantially reduced stresses.

Figure 8:
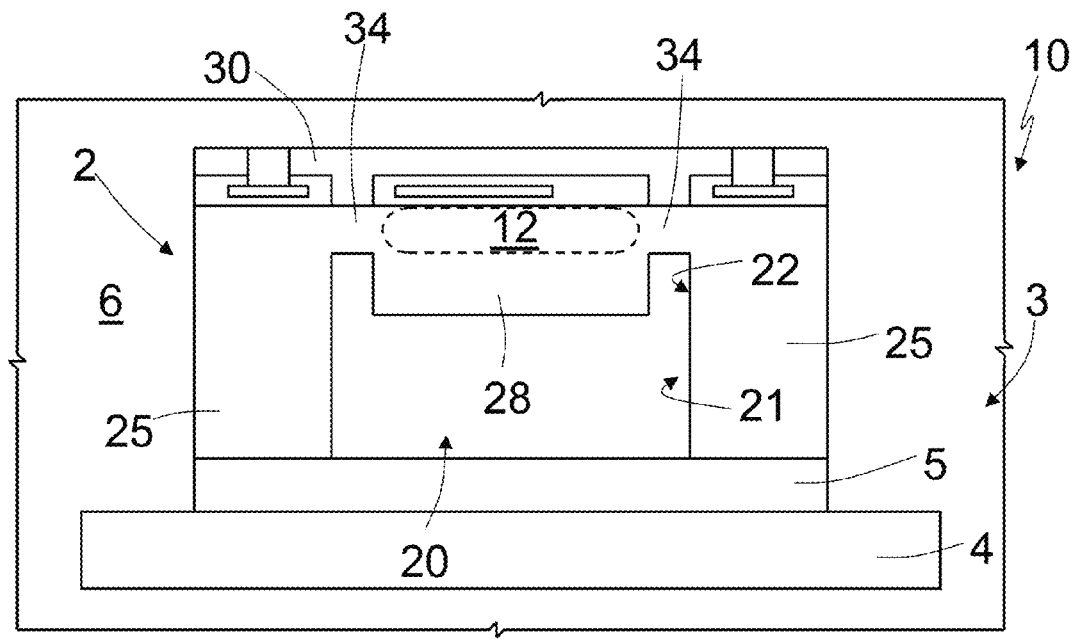
FIG. 8 shows a schematic cross-section of a portion of a semiconductor integrated device according to a third embodiment.

A third embodiment of the integrated device 10 is shown in FIG. 8 and is a variation of the second embodiment shown in FIG. 7, where the stem 28, joined to the active area 12, is not present in the mushroom-shaped structure. Here, the active area 12 is entirely decoupled from the die-carrier 4, while still being connected to the external frame 25. In this case, the first decoupling trench 21, instead of having a rectangular ring cross-section, is simply rectangular in plan view (this just implying a different shape of the second mask layer 33 during the manufacturing process).

Figure 9A:
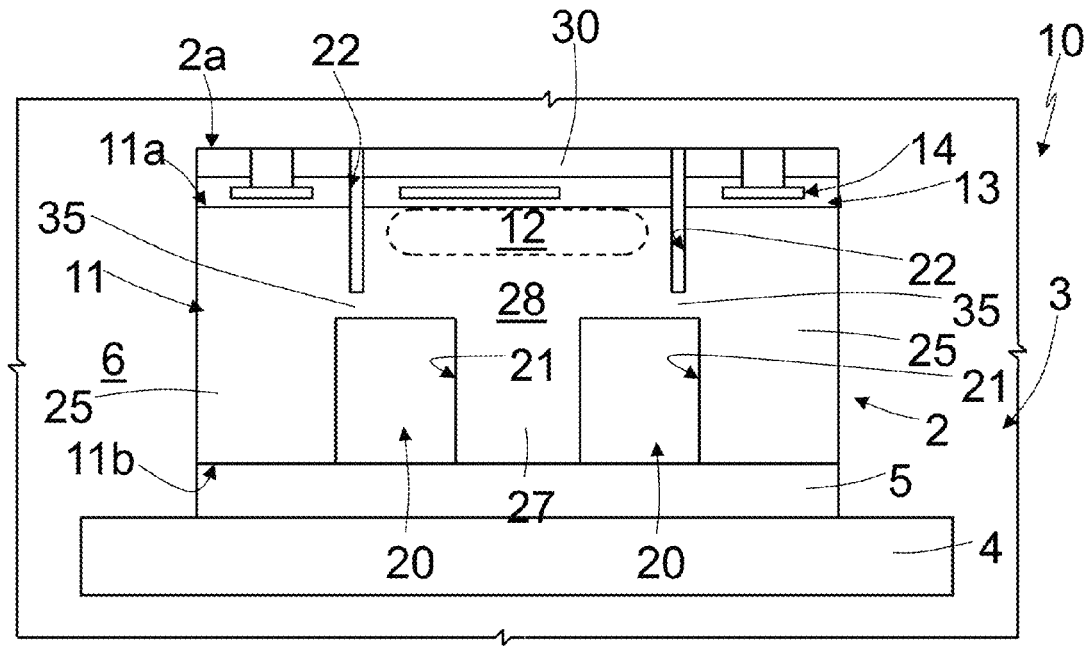
FIGS. 9a, 9b show a schematic cross-section and, respectively, an enlarged top-plan view of a portion of a semiconductor integrated device according to a fourth embodiment.
Figure 9B:
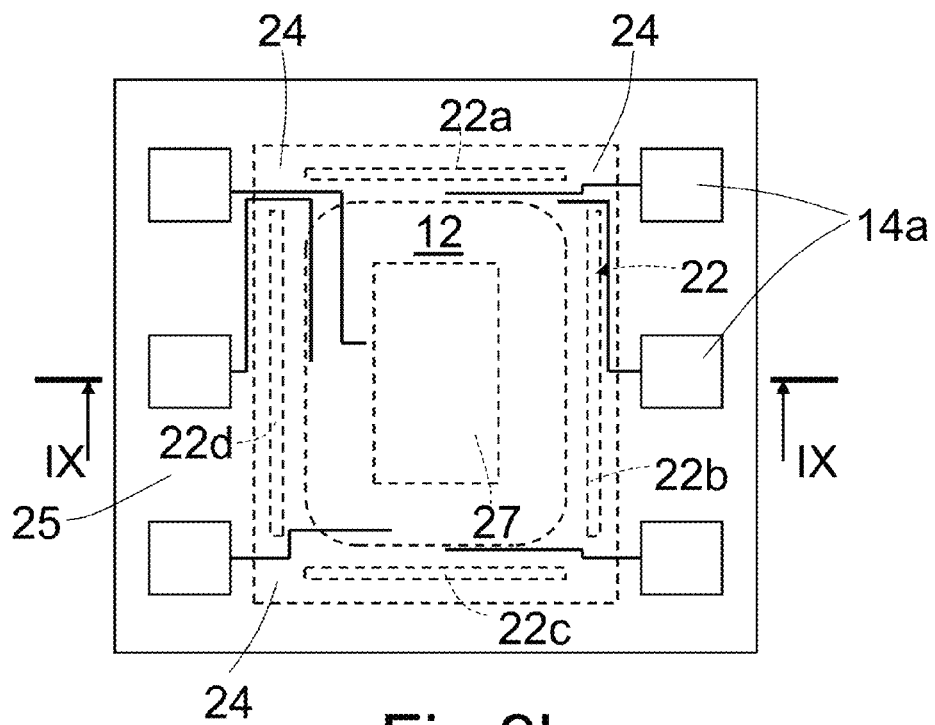

In a fourth embodiment, which is shown in FIGS. 9a, 9b, the weak joint between the active area 12 in the mushroom-shaped structure and the external frame 25 is not defined at a surface portion of the body 11, but instead at a base portion of the head 27, which is joined to the stem 28 and to the external frame via second connecting portions 35 of the body 11. The second decoupling trench 22 extends here also above the front surface 11a of the body 11, traversing the whole thickness of the insulating regions 13 and protective layer 30 and reaching a top face 2a of the die 2. In this case, the second openings 31 through the insulating layer 13 may not be provided, as shown in FIG. 9a. The second decoupling trench 22 is obtained via an etching step from the front of the die 2.

Even in this fourth embodiment the weak joint also constituted here by the second connecting portions 35 at the base portion of the head 27 of the mushroom-shaped structure (in this case, being a "quasi-mushroom" structure) does not prevent the external frame 25 to absorb the package deformations, so that the active area 12 again remains substantially undeformed.

The width of the second decoupling trench 22 (in the first or second horizontal direction x, y) is preferably as narrow as possible (but still able to achieve the mechanical decoupling effect), so as to avoid any resin penetration inside the second decoupling trench 22 during the molding step and formation of the mold compound 6. For example, a width of the second decoupling trench 22 of 3-5 μm is suitable if the resin fillers have a diameter of 10 μm.

Figure 10:
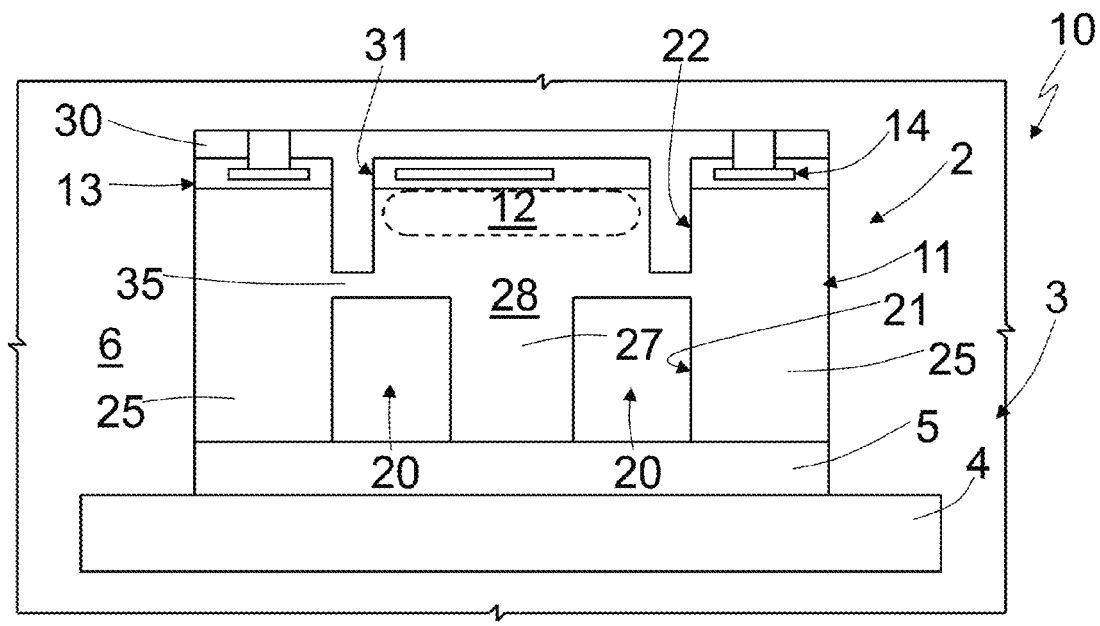
FIG. 10 shows a schematic cross-section of a portion of a semiconductor integrated device according to a fifth embodiment.

A fifth embodiment of the disclosure, shown in FIG. 10, is similar to the fourth embodiment, with the difference that the second decoupling trench 22 is filled with the same material of the protective layer 30, instead of traversing the same protective layer 30 up to the front face 2a of the die 2.

During the manufacturing process, in a way not shown, the second decoupling trench 22 may be formed through the second openings 31 in the insulating regions 13, and then the protective layer 30 may be formed, e.g., via deposition or stacking and reflow process, above the front surface 11a of the body 11, so as to fill also the previously formed second decoupling trench 22.

Since the material of the protective layer 30 is very soft in comparison to the semiconductor material of the body 11 (i.e., silicon), the decoupling performance of the decoupling region 20 is not substantially altered with respect to the previous embodiment discussed with reference to FIGS. 9a, 9b. In particular, protective layer 30 may have a Young Modulus much less than the silicon and resin materials, e.g., 180 MPa, second decoupling trench 22 may have a width of 10 μm, and the height and the length of the second connecting portions 35 may be of 30-50 μm.

Figure 11A:
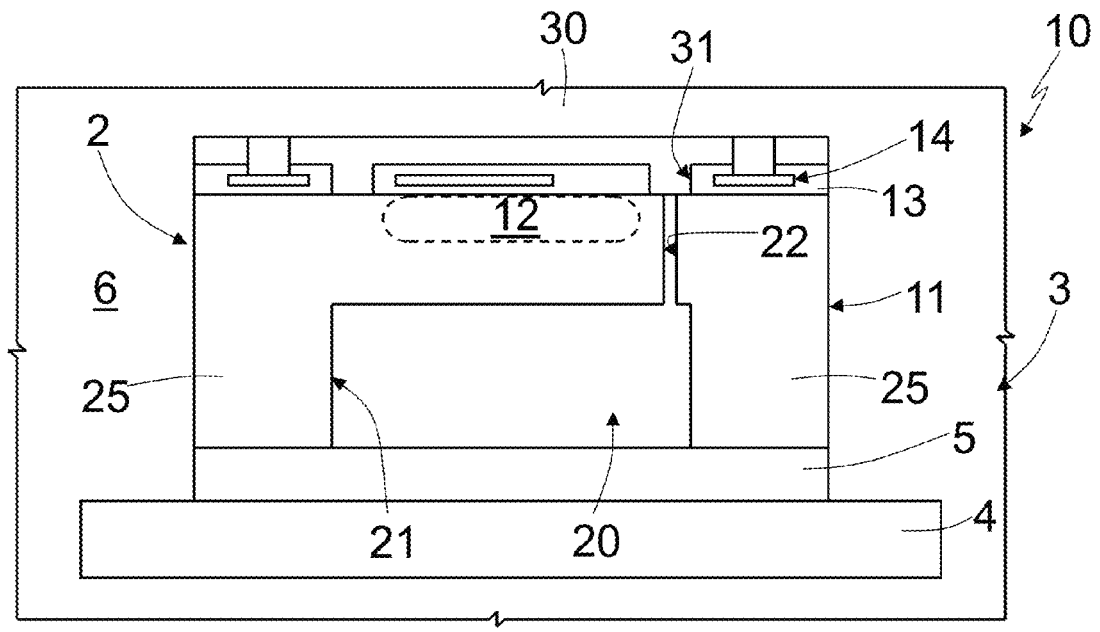
FIGS. 11a, 11b show a schematic cross-section and, respectively, an enlarged top-plan view of a portion of a semiconductor integrated device according to a sixth embodiment.
Figure 11B:
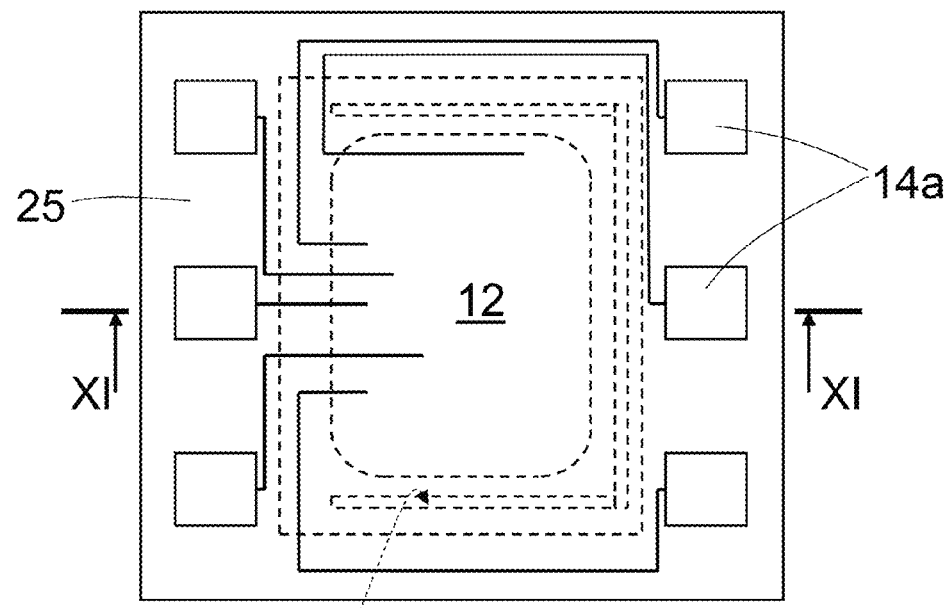

In a sixth embodiment of the disclosure, shown in FIGS. 11a, 11b, the decoupling region 20 is configured so as to define a suspended cantilever structure within the body 11, with the active area 12 being positioned at the top of the cantilever.

In detail, the first decoupling trench 21 has here a full rectangular shape in plan view, and the second decoupling trench 22 surrounds the active area 12 only on three sides thereof, while leaving a fourth side connected to the external frame 25; as shown in FIG. 11b, the second decoupling trench 22 has here a "C" shape in plan view, and again a width that is smaller than that of the second openings 31 defined through the insulating regions 13.

In this sixth embodiment, the cantilever is fully suspended above the cavity defined by the first decoupling trench 21, so that any deformation of the package 3 does not get transferred to the active area 12.

As previously discussed, both the first and second decoupling trenches 21, 22 may be formed via respective etching steps from the back, or else the second decoupling trench 22 may be formed via an etching from the front surface 11a of the body 11, with the subsequently formed protective layer 30 being stacked on the same front surface 11a, via a lamination technique.

According to a further aspect of the present disclosure, all the various structures previously discussed may be encapsulated at the top and/or at the bottom with a cap of semiconductor material (e.g., silicon), in order to avoid interaction between the material of the mold compound (e.g., resin) and the released active area 12.

Figure 12:
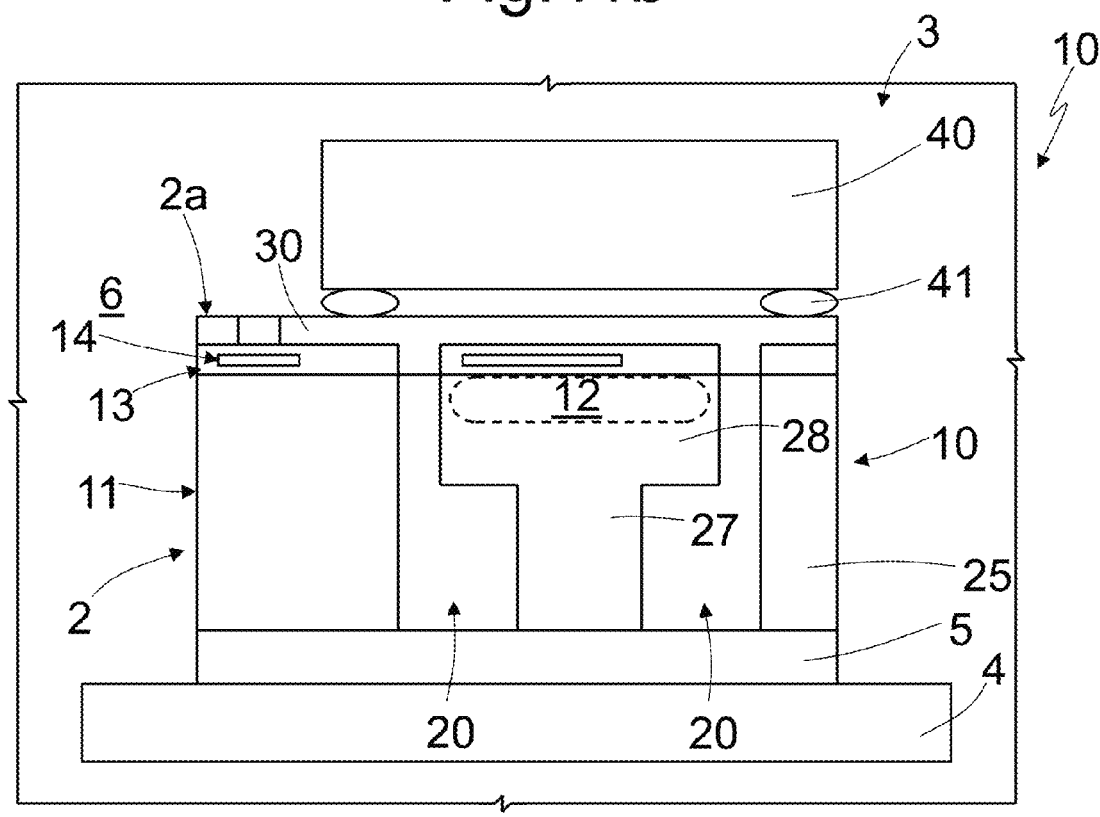
FIGS. 12-14 show further variants of a semiconductor integrated device.

As an example, FIG. 12 shows a top encapsulation of the structure discussed in connection with the first embodiment of the disclosure, where a top cap 40 is arranged above the top face 2a of the die 2, with bonding elements 41 provided between the top cap 40 and the protective layer 30; the bonding elements 41 also define a gap between the facing surfaces of the same top cap 40 and protective layer 30, above the active area 12.

Figure 13:
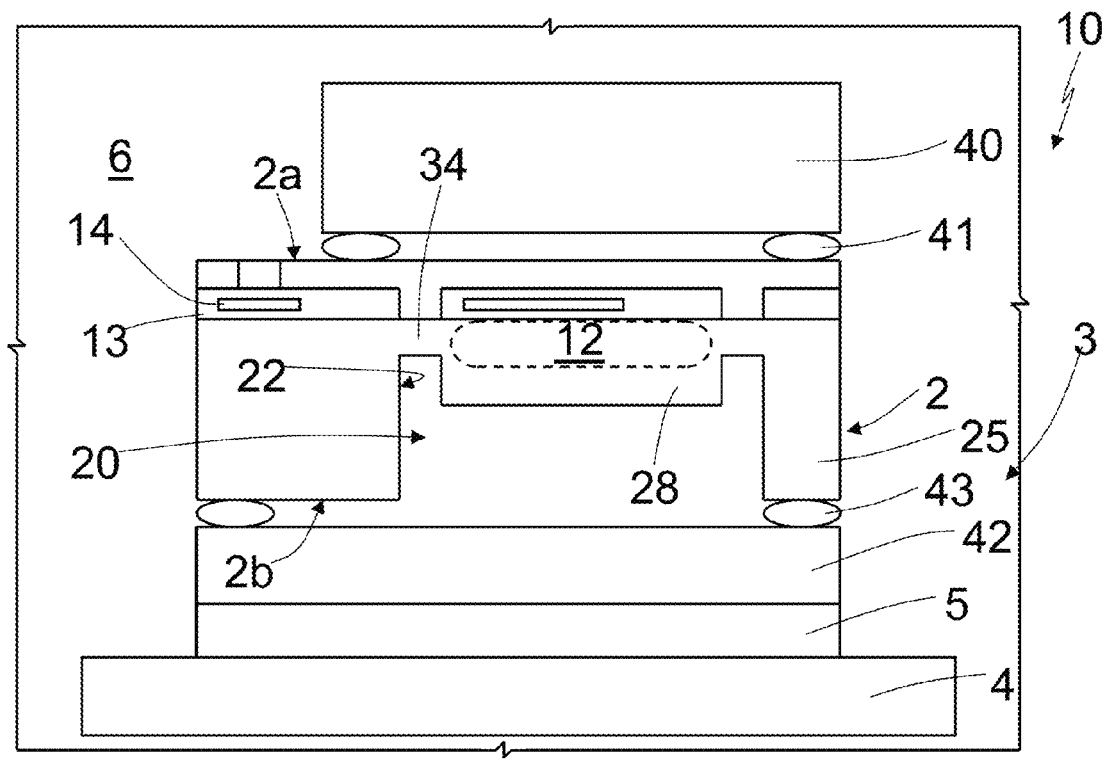

FIG. 13 shows a top and bottom encapsulation of the die 2, in this case having the structure of the third embodiment of the disclosure, where, in addition to the top cap 40 provided on the top face 2a of the die 2, a bottom cap 42, also of semiconductor material (e.g., silicon), is bonded to a bottom face 2b of the die 2, via further bonding elements 43. The bottom cap 42 is thus arranged between the body 11 of the die 2 and the die-carrier 4, and is attached to the die-carrier 4 via the adhesive layer 5.

Figure 14:
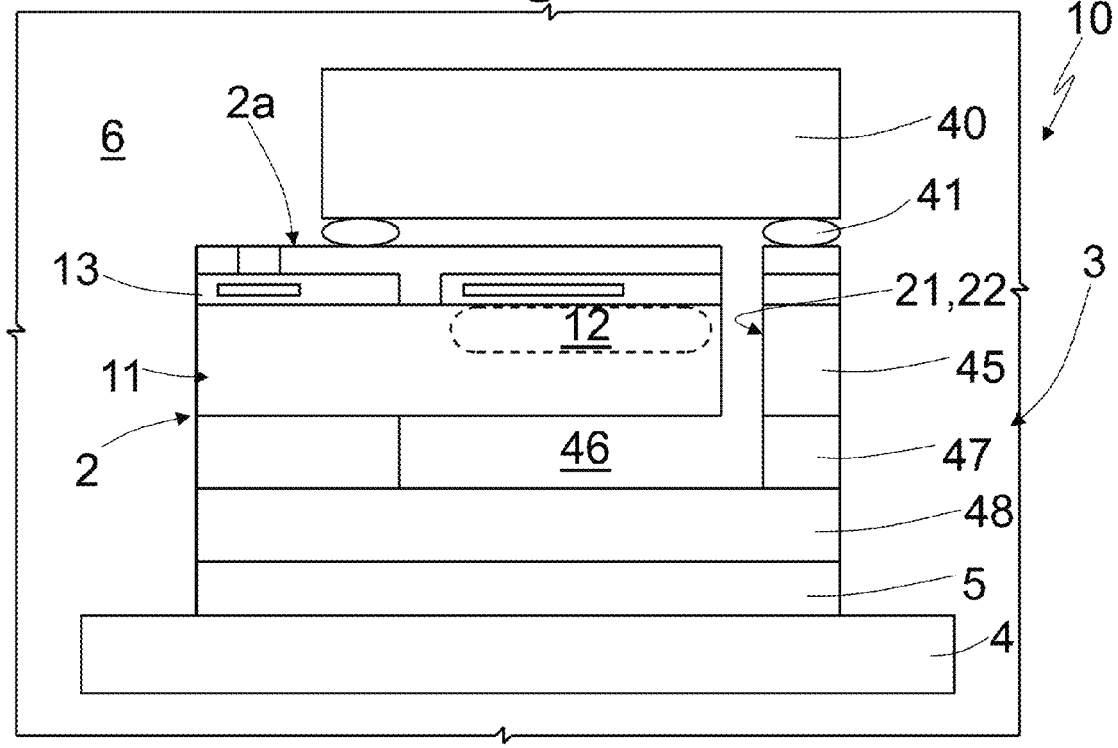

According to a seventh embodiment of the disclosure, which is shown in FIG. 14, protection of the back of the die 2 is provided using an SOI (Silicon On Insulator) wafer, with a pre-etched cavity. In particular, the body 11 integrating the active area 12 is an active layer 45 of the SOI wafer; a cantilever structure for mechanical decoupling of the active area 12 is provided in the body 11 by a passing trench (defined by the first and second decoupling trenches 21, 22). Moreover, a cavity 46 is provided within an insulating layer 47 of the SOI wafer, which allows releasing of the cantilever structure; and a back layer 48 of the SOI wafer constitutes a back cover for the whole structure, which is attached to the die-carrier 4 via the adhesive layer 5.

Figure 15A:
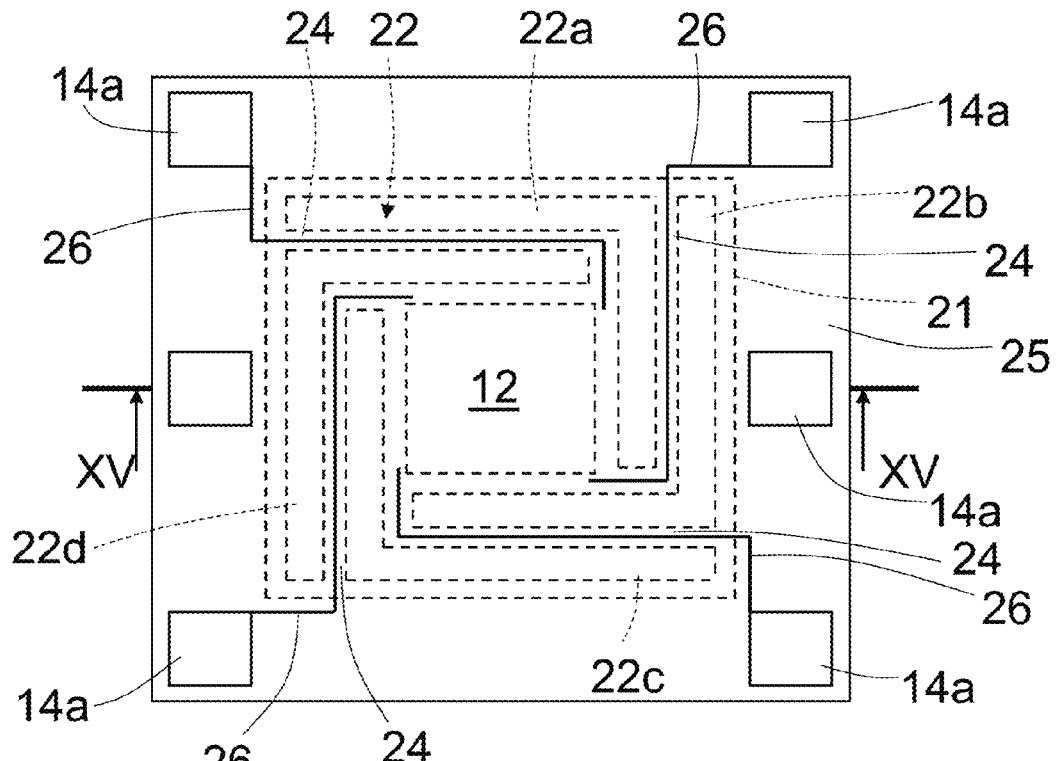
FIGS. 15a, 15b show a schematic cross-section and, respectively, an enlarged top-plan view of a portion of a semiconductor integrated device according to a seventh embodiment.
Figure 15B:
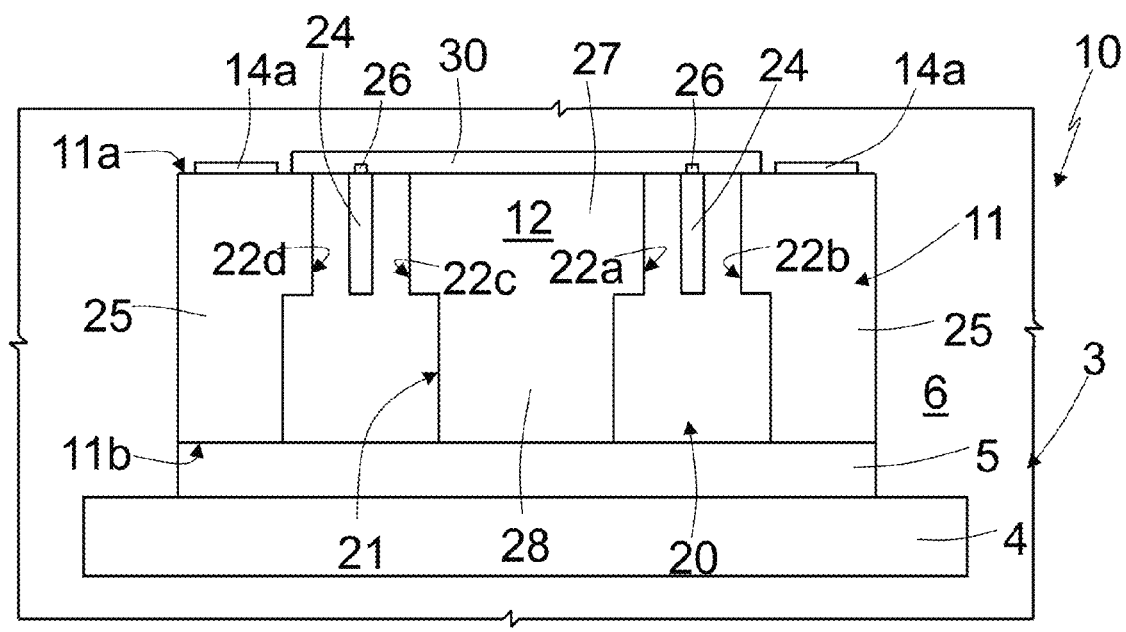

FIGS. 15a, 15b show a seventh embodiment of the disclosure, envisaging still a different mechanical decoupling region, again denoted with 20 (in particular with a different arrangement of the second decoupling trench 22).

In particular, the second decoupling trench 22 is here configured to define the first connecting portions 24 in the form of bridges connecting the island of the active area 12 to the external frame 25. Each first connecting portion 24 has a very small width (e.g., of 10-50 μm) and an elongated shape, connecting a respective corner of the active area 12 to the external frame 25; each first connecting portion 24 extends parallel to a respective side of the active area 12, for an entire length thereof. The four trench portions 22a-22d of the second decoupling trench 22 have here an "L-shape" in plan view and define, between respective arms parallel to each other, the first connecting portions 24. The conductive paths 26 also in this case run, at least in part, at the surface of the first connecting portions 24, so as to electrically connect portions of the active area 12 to respective electrical contact pads 14a.

Advantageously, as it will be apparent, the second connecting portions 24 here constitute a sort of elastic spring elements, contributing to further decouple the active area 12 from the external frame 25 and the package-induced stresses.

From what has been described and illustrated, the advantages that the present disclosure allows to achieve are evident.

In particular, the provision of the decoupling region 20 within the die 2 allows to mechanically decouple the active area 12 of the integrated device 10 from the package 3 and to eliminate or greatly reduce any stress induced by the same package 3 (e.g., due to different thermal expansion coefficients of the various materials).

The solution disclosed, in its various embodiments, is simple and does not require extensive modifications of the manufacturing process of the integrated device 10.

In particular, it is underlined that the arrangement and geometry of the decoupling region 20 may vary according to the specific application and the requirements thereof (e.g., according to the arrangement of the active area 12 in the die 11).

Moreover, the package 3 may be different from what previously discussed; for example, the package may be of the LGA or BGA type. In this case, the back face 2b of the die 2 may be attached to a substrate of the package, carrying suitable electrical connection elements to the outside, as an array of pads in the form of "balls" or "bumps" (in the case of BGA packages) or "lands" (in the case of LGA packages) of metallic or other conductive material. Vias and suitable traces may be provided through the substrate to route the signals between the die 2 and the electrical connection elements (these being either processing and detection signals or power supply signals, or any other kind of signals exchanged between the integrated device 10 and external devices).

In general, the disclosed solution may be advantageously applied for any plastic package encapsulating at least one semiconductor die 2, and having a mold compound 6 covering the die 2 and a die-carrier 4 to which the die 2 is attached.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor integrated device comprising:
a die having a body of semiconductor material with a front surface, a back surface, and an external frame, an active area arranged at the front surface, a coating material covering a portion of the front surface, the body including a trench arrangement that is configured to mechanically decouple the active area from stresses, wherein the trench arrangement is configured to release the active area from the external frame of the body; and
a package that includes mold compound and a support element, the back surface of the die being located on the support element, the external frame being configured to absorb the stresses induced by the package.

2. The semiconductor integrated device according to claim 1, wherein the trench arrangement defines within the body a mechanically released structure having a mushroom shape, the mushroom shape includes a head portion and a stem portion, the head portion includes the active area and the stem portion has a base that is configured to be attached to the support element of the package.

3. A semiconductor integrated device comprising:
a die having a body of semiconductor material with a front surface, a back surface, and an external frame, an active area arranged at the front surface, a coating material covering a portion of the front surface, the body including a trench arrangement that is configured to mechanically decouple the active area from stresses, wherein the trench arrangement includes a first decoupling trench arranged between the active area and the back surface of the body, and a second decoupling trench laterally separating the active area from the external frame; and
a package that includes mold compound and a support element, the back surface of the die being located on the support element.

4. The semiconductor integrated device according to claim 3, wherein the first decoupling trench has a square ring shape in plan view, the square ring shape is located outwardly of the active area and is arranged at least in part below the active area.

5. The semiconductor integrated device according to claim 3, wherein the second decoupling trench includes trench portions that collectively laterally surround most of the active area, each of the trench portions being arranged proximate a respective side of the active area.

6. The semiconductor integrated device according to claim 3, wherein the second decoupling trench defines first connecting portions of the body, the first connecting portions connecting respective corners of the active area to the external frame.

7. The semiconductor integrated device according to claim 6, wherein the connecting portions have an elongated shape, defining elastic elements for the mechanical decoupling of the active area from the external frame.

8. The semiconductor integrated device according to claim 3, wherein the first and second decoupling trenches together define passing trenches within the body, the passing trenches traversing the body from the back surface to the front surface.

9. The semiconductor integrated device according to claim 3, wherein the second decoupling trench starts from the first decoupling trench and ends at a distance from the front surface and defines a surface layer of the body connecting the active area to the external frame.

10. The semiconductor integrated device according to claim 9, wherein the active area is suspended above the first decoupling trench.

11. The semiconductor integrated device according to claim 3, wherein the second decoupling trench starts from the front surface of the body and ends at a distance from the first decoupling trench, thereby defining second connecting portions of the body located between the first and second decoupling trenches, the second connecting portions connecting the active area to the external frame.

12. The semiconductor integrated device according to claim 11, wherein the die further includes a protective layer arranged above the front surface of the body; and wherein the second decoupling trench is filled with the protective layer.

13. The semiconductor integrated device according to claim 3, wherein the second decoupling trench defines a cantilever structure by surrounding the active area around all but one side of the active area, the cantilever structure having the active area suspended above the first decoupling trench.

14. The semiconductor integrated device according to claim 1, further including at least one of:
a front cap of semiconductor material coupled to the die above the active area; and
a back cap of semiconductor material coupled to the die and interposed between the die and the support element.

15. A semiconductor integrated device comprising:
a die having a body of semiconductor material with a front surface and a back surface, an active area arranged at the front surface, a coating material covering a portion of the front surface, the body including a trench arrangement configured to mechanically decouple the active area from stresses, wherein the trench arrangement includes a decoupling trench laterally separating the active area from the external frame, the die further including a protective polyamide or dry-film layer arranged above the front surface of the body and above the decoupling trench; and
a package that includes mold compound and a support element, the back surface of the die being located on the support element.

16. A semiconductor package comprising:
a support element;
a semiconductor die having a body with a first surface and a second surface, the semiconductor die having a first portion that includes an active area arranged at the first surface and a second portion, the second surface of the semiconductor die being located on the support element, the semiconductor die including trenches formed in the body proximate the active area, wherein the trenches form elastic elements coupling the first portion of the semiconductor die to the second portion of the semiconductor die, and wherein the elastic elements are configured to absorb stresses induced by the semiconductor package; and a molding compound surrounding at least a portion of the support element and the semiconductor die.

17. The semiconductor package according to claim 16, wherein the trenches extend from the first surface to the second surface and substantially surround the active area.

18. The semiconductor package according to claim 16, wherein the trenches extend from the second surface to the elastic element, the elastic element being a portion of the body that is located between the first surface of the body and a portion of the top of the trenches.

19. The semiconductor package according to claim 16, wherein the trenches includes first trenches that extend from the first surface of the body and second trenches that extend from the second surface of the body, wherein at least some of the elastic elements are located in the body between the first trenches and the second trenches.

20. The semiconductor package according to claim 16, wherein the stresses are at least one of mechanical and thermal stresses.

21. The semiconductor integrated device according to claim 15, wherein the trench arrangement is configured to release the active area from an external frame of the body, the external frame being configured to absorb the stresses induced by the package.

* * * * *